(12) United States Patent
Watarai et al.

(10) Patent No.: US 7,602,064 B2
(45) Date of Patent: Oct. 13, 2009

(54) SEMICONDUCTOR DEVICE HAVING AN INSPECTION HOLE STRIDING A BOUNDARY

(75) Inventors: Masatoshi Watarai, Kanagawa (JP); Ryuichi Okamura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 260 days.

(21) Appl. No.: 11/325,482

(22) Filed: Jan. 5, 2006

(65) Prior Publication Data
US 2006/0163748 A1  Jul. 27, 2006

(30) Foreign Application Priority Data
Jan. 24, 2005  (JP)  ............... 2005-016067

(51) Int. Cl.
*H01L 23/58* (2006.01)
(52) U.S. Cl. ............ 257/758; 257/773; 257/774; 257/E21.522; 257/E21.523
(58) Field of Classification Search ............ 438/926; 257/E21.522, E21.523
See application file for complete search history.

(56) References Cited

U.S. PATENT DOCUMENTS

| | | | |
|---|---|---|---|
| 5,846,876 A | * | 12/1998 | Bandyopadhyay et al. .. 438/622 |
| 2005/0179134 A1 | * | 8/2005 | Matsubara ............... 257/758 |
| 2005/0200026 A1 | * | 9/2005 | Liaw ..................... 257/774 |

FOREIGN PATENT DOCUMENTS

| | | |
|---|---|---|
| JP | 04-012531 | 1/1992 |
| JP | 10-256366 | 9/1998 |
| JP | 11-163133 | 6/1999 |
| JP | 2003-124277 | 4/2003 |
| JP | 2004-119449 | 4/2004 |

* cited by examiner

*Primary Examiner*—Kenneth A Parker
*Assistant Examiner*—Jose R Diaz
(74) *Attorney, Agent, or Firm*—Young & Thompson

(57) ABSTRACT

The semiconductor device includes a semiconductor substrate, a diffusion layer, an interconnect layer, a contact plug, a contact-inspection hole, a via plug, and a via-inspection hole. Similarly to a contact plug hole, the contact-inspection hole extends from the diffusion layer to the interconnect layer. The opening of the contact-inspection hole on the side of the diffusion layer is disposed across the boundary of the diffusion layer. Also, similarly to a via plug hole, the via-inspection hole extends from an interconnect to an interconnect layer. The opening of the via-inspection hole on the side of the interconnect is disposed across the boundary of the interconnect.

7 Claims, 8 Drawing Sheets

SEMICONDUCTOR DEVICE HAVING AN INSPECTION HOLE STRIDING A BOUNDARY

This application is based on Japanese patent application No. 2005-016067, the content of which is incorporated hereinto by reference.

BACKGROUND

1. Technical Field

The present invention relates to a semiconductor device.

2. Related Art

The integration level and micronization of semiconductor devices are advancing further and further. This naturally requires designing a contact for connecting an interconnect layer and an electrode of elements such as transistors and capacitors, and a via for connecting the interconnect layers, in a smaller diameter. If a contact or a via (hereinafter generally referred to as "conductive plug") is not properly opened, the semiconductor device results in being defective. Accordingly, in-line inspection of the conductive plug hole is becoming more critically important. Such inspection can be executed by providing an inspection hole apart from the conductive plug hole, and observing the bottom of the inspection hole through a scanning electron microscope (SEM).

In this relation, for example JP-A No. 2004-119449 discloses a semiconductor device as shown in FIG. 7, which is a plan view for explaining positioning of an inspection hole in the semiconductor device. In FIG. 7, an inspection hole 101 in the conventional semiconductor device is located, like the conductive plug hole, on a diffusion layer or an interconnect layer 102.

SUMMARY OF THE INVENTION

With the structure as shown in FIG. 7, however, only the diffusion layer or the interconnect layer 102 is exposed at the bottom of the inspection hole 101, as shown in FIG. 8. Here, FIG. 8 is a schematic drawing of a SEM image taken at the time of the inspection of the hole. Accordingly, the SEM only provides a uniform image of the bottom of the inspection hole 101, from which it is difficult to decide whether the hole is properly formed. Just because of the foregoing progress in integration level and micronization of the semiconductor device, this problem has come up as an important issue to be addressed.

According to the present invention, there is provided a semiconductor device comprising a semiconductor substrate; a diffusion layer provided in a surface layer of the semiconductor substrate; an interconnect layer provided at an upper level from the semiconductor substrate; a conductive plug provided in a plug hole extending from the diffusion layer to the interconnect layer; and an inspection hole extending from the diffusion layer to the interconnect layer; wherein the inspection hole is located so that an opening of the inspection hole on the side of the diffusion layer strides across a boundary of the diffusion layer.

The semiconductor device thus configured includes the inspection hole extending from the diffusion layer to the interconnect layer, like the plug hole. Moreover, the opening of the inspection hole on the diffusion layer side strides across the boundary of the diffusion layer. With such structure, the boundary of the diffusion layer can be recognized at the in-line inspection, when the hole is properly formed. This significantly facilitates deciding whether the hole is properly formed.

The present invention also provides a semiconductor device comprising a first interconnect; a second interconnect layer provided at an upper level of a first interconnect layer including the first interconnect; a conductive plug provided in a plug hole extending from the first interconnect layer to the second interconnect layer; and an inspection hole extending from the first interconnect layer to the second interconnect layer; wherein the inspection hole is located so that an opening of the inspection hole on the side of the first interconnect layer strides across a boundary of the first interconnect layer.

The semiconductor device thus configured includes the inspection hole extending from the first interconnect layer to the second interconnect layer, like the plug hole. Moreover, the opening of the inspection hole on the first interconnect layer side strides across the boundary of the first interconnect layer. With such structure, the boundary of the first interconnect layer can be recognized at the in-line inspection, when the hole is properly formed. This significantly facilitates deciding whether the hole is properly formed.

Accordingly, the present invention provides a semiconductor device that facilitates effectively inspecting the conductive plug holes.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereunder, a preferred embodiment of a semiconductor device according to the present invention will be described in details, referring to the accompanying drawings. Regarding the drawings, same constituents are given the same numerals, and duplicating description thereof will be omitted.

Figure 1:
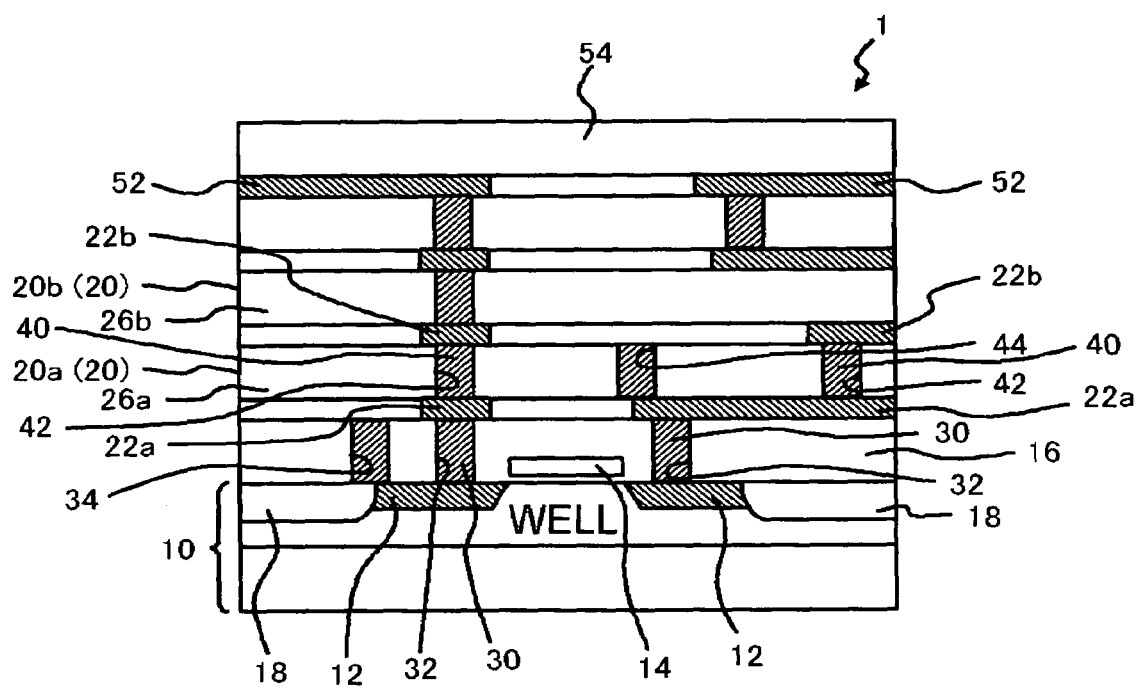
FIG. 1 is a cross-sectional view showing a semiconductor device according to an embodiment of the present invention.

FIG. 1 is a cross-sectional view showing the semiconductor device according to the embodiment of the present invention. The semiconductor device 1 includes a semiconductor substrate 10, a diffusion layer 12, an interconnect layer 20, a contact plug 30, a contact-inspection hole 34, a via plug 40, and a via-inspection hole 44.

In the surface layer of the semiconductor substrate 10, the diffusion layer 12 is provided. The diffusion layer 12, a gate electrode 14 and so on constitute a MOS transistor. An insulating layer 16 is provided so as to bury the MOS transistor. In the surface layer of the semiconductor substrate 10, also an isolation region 18 is provided.

Above the semiconductor substrate 10, the interconnect layer 20 is provided. The interconnect layer 20 includes an interconnect layer 20a (first interconnect layer) and an interconnect layer 20b (second interconnect layer). The interconnect layers 20a, 20b respectively include an interconnect 22a (first interconnect) and an interconnect 22b (second interconnect). In the interconnect layer 20a, the interconnect 22a is covered with an insulating layer 26a. Likewise, in the interconnect layer 20b the interconnect 22b is covered with an insulating layer 26b.

The insulating layer 16 includes a contact plug hole 32. The contact plug hole 32 penetrates through the insulating layer 16, thus extending from the diffusion layer 12 to the interconnect layer 20. The contact plug hole 32 includes the contact plug 30. The contact plug 30 has one end connected to the diffusion layer 12, and the other end connected to the interconnect 22a. The contact plug 30 serves as a conductive plug that electrically connects the diffusion layer 12 and the interconnect 22a.

The insulating layer 16 also includes the contact-inspection hole 34. Similarly to the contact plug hole 32, the contact-inspection hole 34 also penetrates through the insulating layer 16 thus extending from the diffusion layer 12 to the interconnect layer 20. The contact-inspection hole 34 is generally the same as the contact plug hole 32 in diameter, depth and profile.

Figure 2:
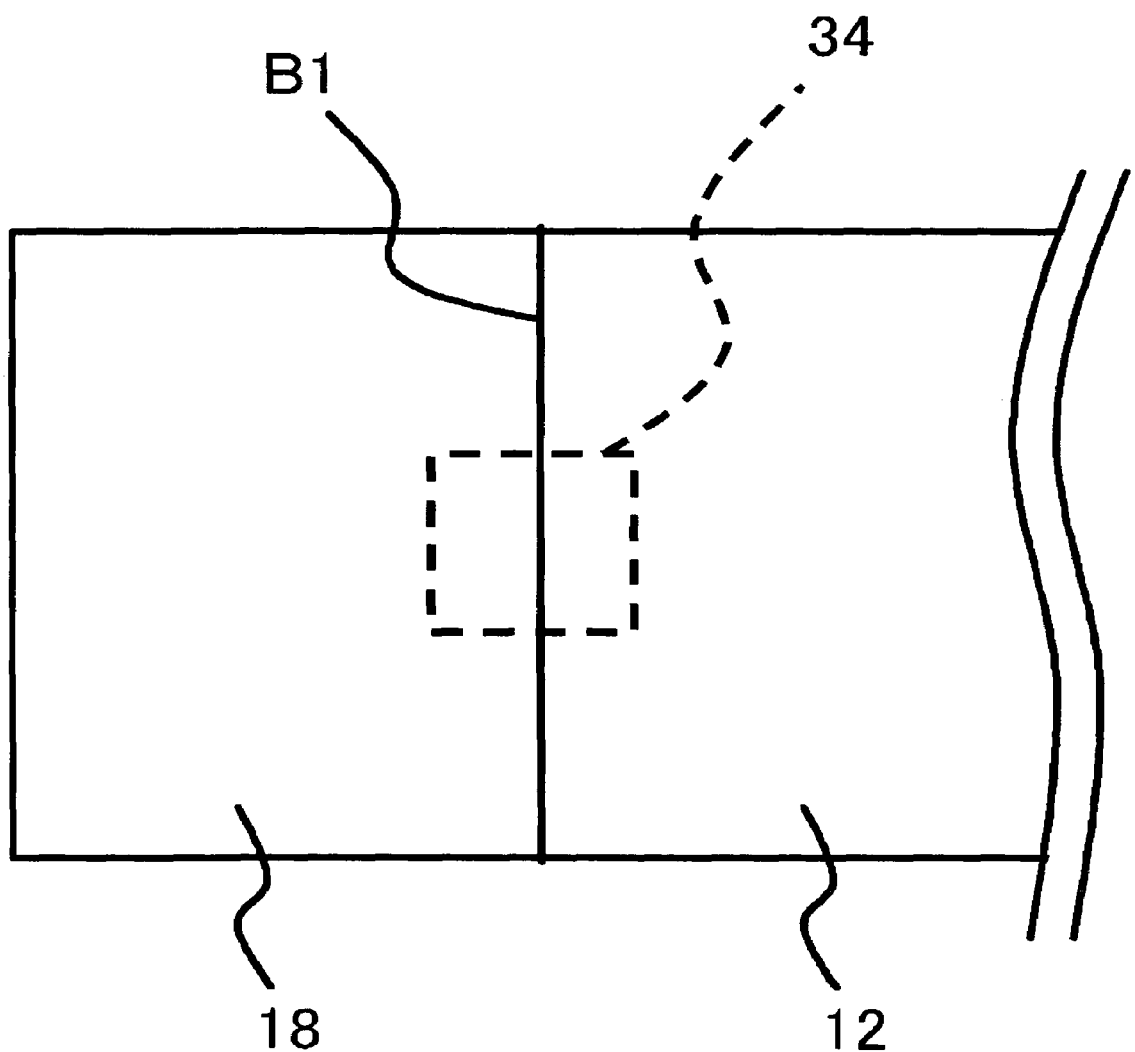
FIG. 2 is an enlarged fragmentary plan view of the same, for explaining positioning of a contact-inspection hole.

Referring to FIG. 2, the positioning of the contact-inspection hole 34 will be described. As is apparent from FIG. 2, the opening of the contact-inspection hole 34 on the side of the diffusion layer 12 is disposed across the boundary B1 of the diffusion layer 12, on the surface of the semiconductor substrate 10. In this embodiment, the boundary B1 represents the boundary between the diffusion layer 12 and the isolation region 18.

Referring back to FIG. 1, the insulating layer 26a includes a via plug hole 42. The via plug hole 42 penetrates through the insulating layer 26a, thus extending from the interconnect 22a to the interconnect layer 20b. The via plug hole 42 includes the via plug 40. The via plug 40 has one end connected to the interconnect 22a, and the other end connected to the interconnect 22b. The via plug 40 serves as a conductive plug that electrically connects the interconnect 22a and the interconnect 22b.

The insulating layer 26a also includes the via-inspection hole 44. Similarly to the via plug hole 42, the via-inspection hole 44 also penetrates through the insulating layer 26a thus extending from the interconnect 22a to the interconnect layer 20b. The via-inspection hole 44 is generally the same as the via plug hole 42 in diameter, depth and profile.

Figure 3:
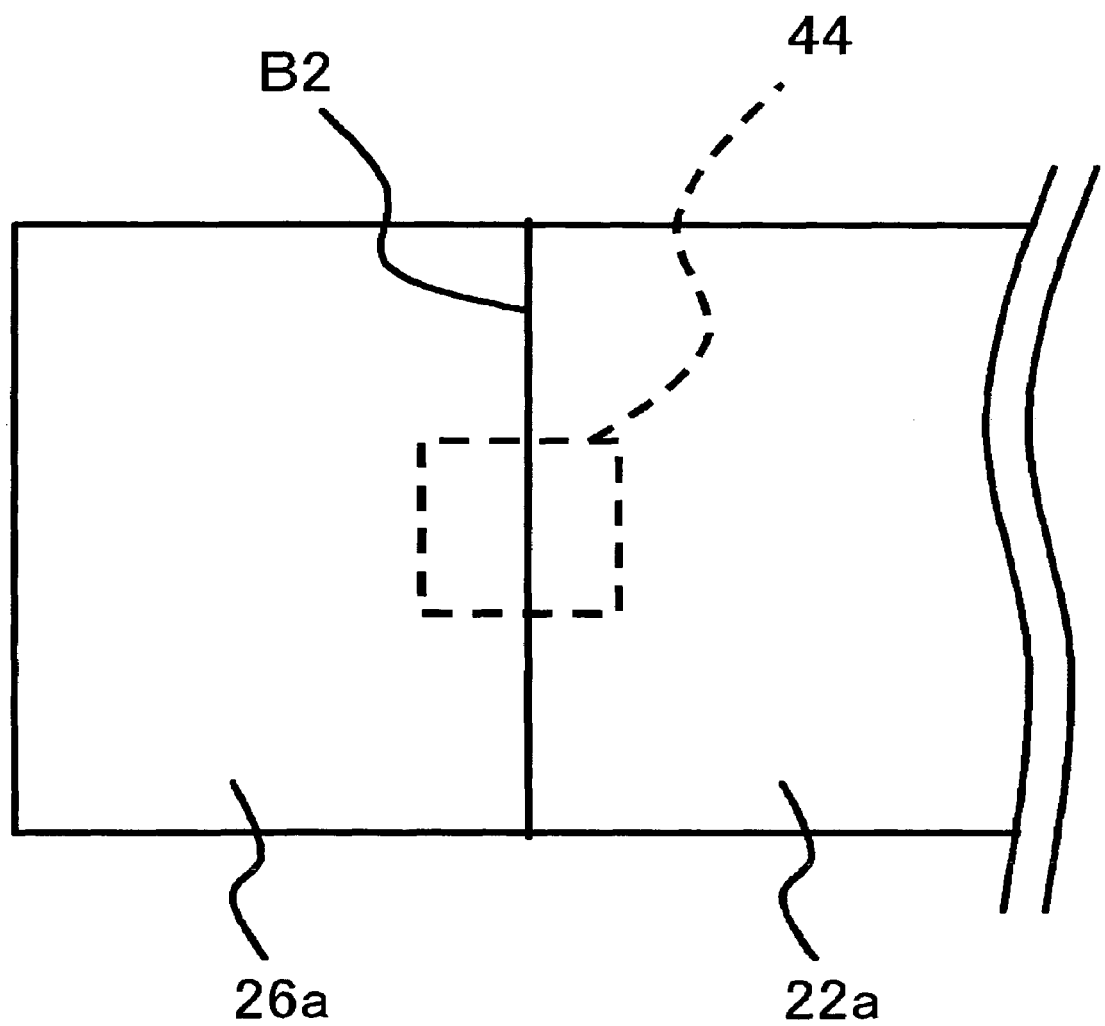
FIG. 3 is an enlarged fragmentary plan view of the same, for explaining positioning of a via-inspection hole.

Referring to FIG. 3, the positioning of the via-inspection hole 44 will be described. As is apparent from FIG. 3, the opening of the via-inspection hole 44 on the side of the interconnect 22a is disposed across the boundary B2 of the interconnect 22a. In this embodiment, the boundary B2 represents the boundary between the interconnect 22a and the insulating layer 26a.

Again back to FIG. 1, on the interconnect layer 20b, another interconnect layer of a similar structure to that of the interconnect layers 20a, 20b is stacked. At an uppermost level, an uppermost interconnect 52, and a passivation layer 54 covering the uppermost interconnect 52 are provided.

Figure 4:
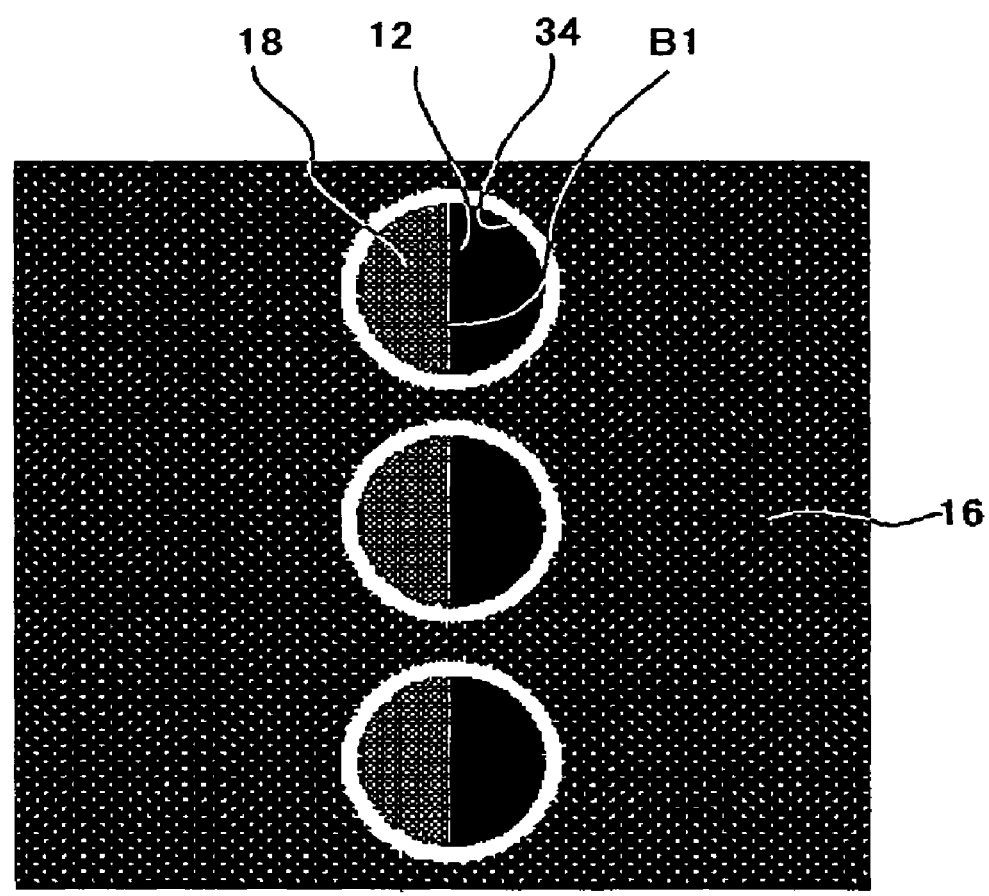
FIG. 4 is a schematic drawing of a SEM image taken at a contact hole inspection of the semiconductor device according to the embodiment.

Advantageous effects of the semiconductor device 1 are described here below. The semiconductor device 1 includes the contact-inspection hole 34 extending from the diffusion layer 12 to the interconnect layer 20. Here, the opening of the contact-inspection hole 34 on the side of the diffusion layer 12 strides across the boundary B1 (FIG. 2) of the diffusion layer 12. Under such structure, the boundary B1 of the diffusion layer 12 can be recognized at the bottom of the contact-inspection hole 34, at the in-line inspection thereof as shown in FIG. 4, provided that the hole is properly formed. At the bottom of the contact-inspection hole 34, the diffusion layer 12 and the isolation region 18 are exposed on the respective sides of the boundary B1. FIG. 4 is a schematic drawing of a SEM image taken at the contact hole inspection. Such structure significantly facilitates deciding whether the contact plug hole 32 is properly formed.

Figure 5:
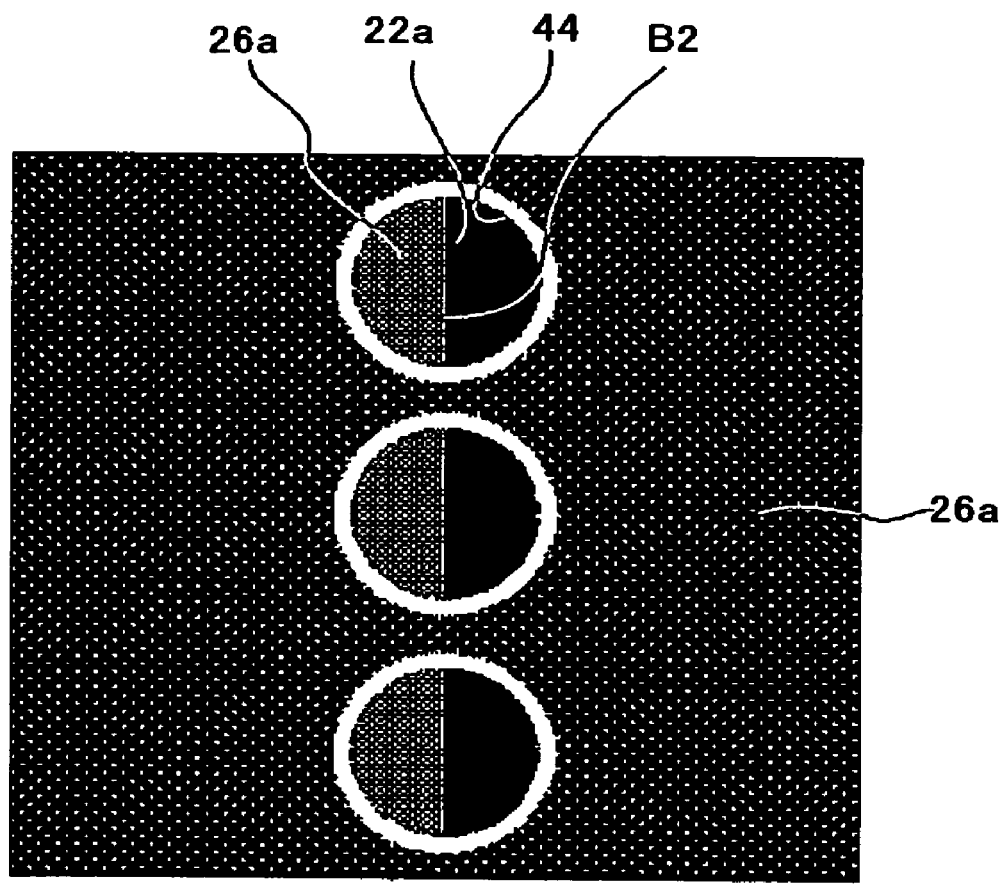
FIG. 5 is a schematic drawing of a SEM image taken at a via hole inspection of the semiconductor device according to the embodiment.

Further, the semiconductor device 1 includes the via-inspection hole 44 extending from the interconnect 22a to the interconnect layer 20b. Here, the opening of the via-inspection hole 44 on the side of the interconnect 22a strides across the boundary B2 (FIG. 3) of the interconnect 22a. Under such structure, the boundary B2 of the interconnect 22a can be recognized at the bottom of the via-inspection hole 44, at the in-line inspection thereof as shown in FIG. 5, provided that the hole is properly formed. At the bottom of the via-inspection hole 44, the interconnect 22a and the insulating layer 26a are exposed on the respective sides of the boundary B2. FIG. 5 is a schematic drawing of a SEM image taken at the via hole inspection. Such structure significantly facilitates deciding whether the via-inspection hole 42 is properly formed.

While the semiconductor device according to this embodiment includes both of the contact-inspection hole 34 and the via-inspection hole 44, the semiconductor device may include only either thereof. Also, the number the interconnect layers is not limited to that of the structure shown in FIG. 1, but may be any different number.

Figure 6:
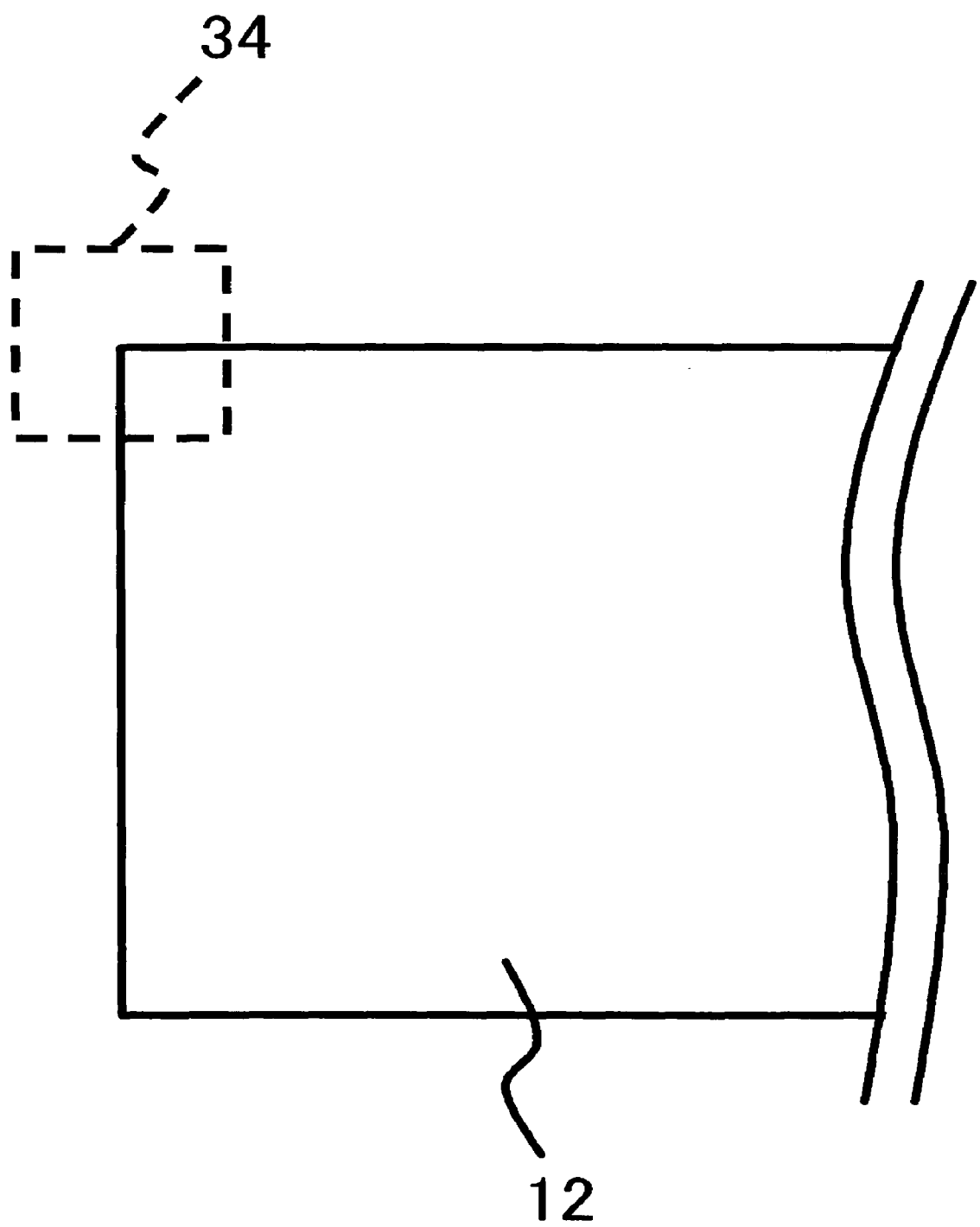
FIG. 6 is an enlarged fragmentary plan view showing a variation of the semiconductor device according to the embodiment.
Figure 7:
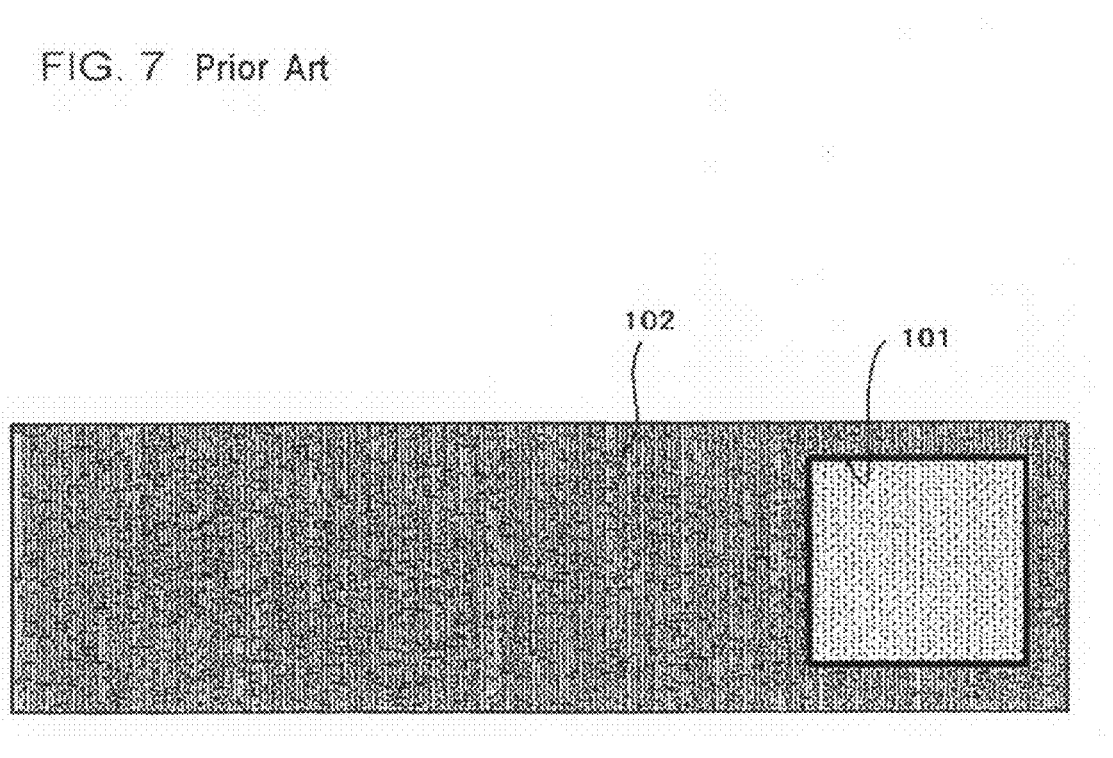
FIG. 7 is a plan view of a conventional semiconductor device, for explaining the positioning of the inspection hole.
Figure 8:
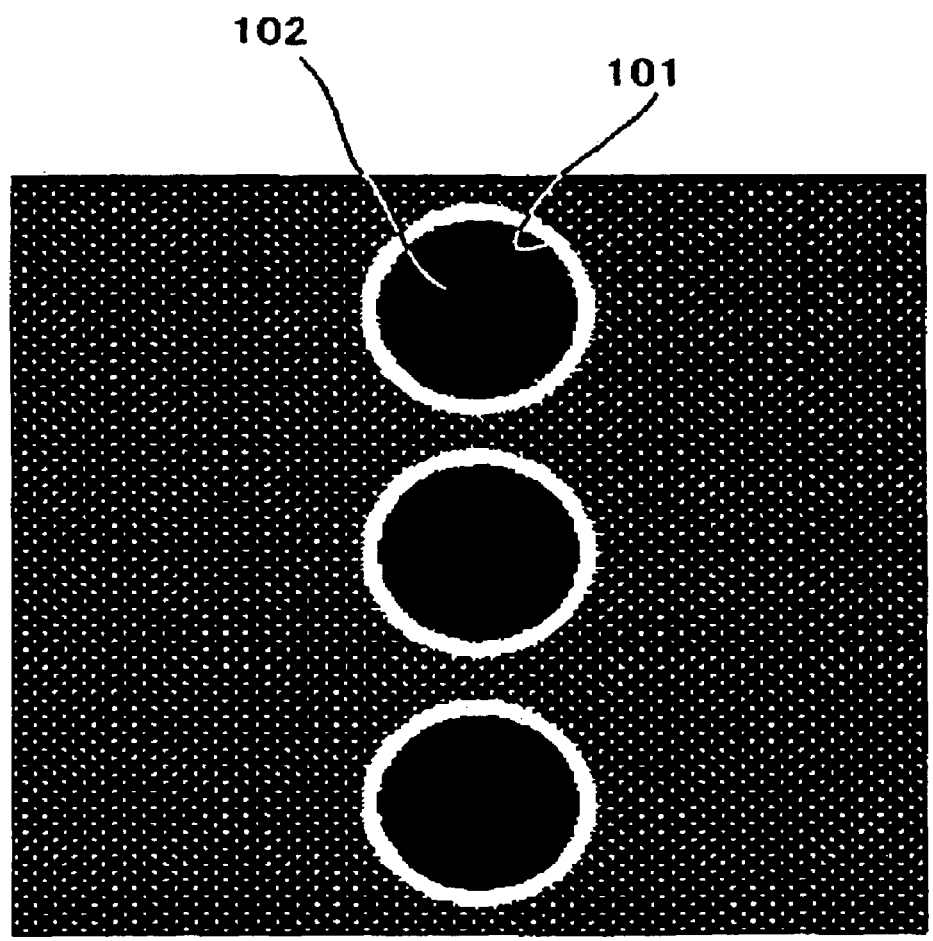
FIG. 8 is a schematic drawing of a SEM image taken at a contact hole inspection of the conventional semiconductor device.

Further, the contact-inspection hole 34 may be disposed in various different manners, as long as being located so as to stride across the boundary of the diffusion layer 12. For example, the contact-inspection hole 34 may be disposed so that the opening thereof on the side of the diffusion layer 12 partially overlaps a corner portion of the diffusion layer 12, as shown in FIG. 6. This also applies to the via-inspection hole 44, i.e. the opening on the side of the interconnect 22a may be disposed so as to partially overlap a corner portion of the interconnect 22a.

Further, in this embodiment, while the contact-inspection hole 34 and the via-inspection hole 44 are filled with the conductive materials constituting the contact plug 30 and the via plug 40, the contact-inspection hole 34 and the via-inspection hole 44 may be not filled with anything. That is, there may remain a gap in the contact-inspection hole 34 and/or the via-inspection hole 44.

It is apparent that the present invention is not limited to the above embodiment, and may be modified and changed without departing from the scope and spirit of the invention.

What is claimed is:

1. A semiconductor device comprising:
   a semiconductor substrate;
   a plurality of layers including a surface layer of said semiconductor substrate and stacked layers provided over said semiconductor substrate with intervening insulation films there between, one of said layers having a first portion made of a first material and a second portion laterally adjacent to said first portion and made of a second material, said first material being different from said second material, another one of said layers being stacked above said one of said layers and having an interconnect portion and a third portion made of a third material different from said interconnect portion; and an inspection hole having a top surface thereof facing to said third portion of said another one of said layers and having a bottom surface thereof facing only to said one of said layers, said inspection hole at said bottom surface thereof exposing a boundary between said first portion and said second portion of said one of said layers.

2. A semiconductor device comprising:

a first interconnect;

a second interconnect layer provided at an upper level of a first interconnect layer including said first interconnect;

a conductive plug provided in a plug hole extending from said first interconnect layer to said second interconnect layer; and an inspection hole extending from said first interconnect layer only to a nonelectrically conducting portion of said second interconnect layer;

wherein said inspection hole is located so that an opening of said inspection hole on the side of said first interconnect layer strides across a boundary of said first interconnect.

3. The semiconductor device according to claim 1, further comprising a conductive material filling said inspection hole.

4. The semiconductor device according to claim 1, wherein said one of said layers is a surface layer of said semiconductor substrate, and said first portion of said one of said layers is a diffusion layer, and said second portion of said one of said layers is an isolation region.

5. The semiconductor device according to claim 1, wherein said first portion of said one of said layers is another interconnect formed in said one of said layers.

6. The semiconductor device according to claim 1, further comprising:

a plug hole separate from said inspection hole and connecting said interconnect formed in said another one of said layers to said first portion of said one of said layers; and a plug filling said plug hole and electrically connecting said interconnect with said first portion.

7. The semiconductor device according to claim 1, wherein, said layers further includes an insulating layer formed between said one of said layers and said another one of said layers, wherein said inspection hole penetrates said insulating layer.

* * * * *

UNITED STATES PATENT AND TRADEMARK OFFICE
CERTIFICATE OF CORRECTION

PATENT NO. : 7,602,064 B2  Page 1 of 1
APPLICATION NO. : 11/325482
DATED : October 13, 2009
INVENTOR(S) : Watarai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 539 days.

Signed and Sealed this

Fifth Day of October, 2010

David J. Kappos
*Director of the United States Patent and Trademark Office*